United States Patent
Rossberg et al.

(10) Patent No.: US 10,099,318 B2
(45) Date of Patent: Oct. 16, 2018

(54) METHOD FOR CONNECTING A COMPONENT TO A SUPPORT VIA SOLDERING AND COMPONENT CONNECTABLE WITH A SUPPORT

(71) Applicant: Endress + Hauser GmbH + Co. KG, Maulburg (DE)

(72) Inventors: Andreas Rossberg, Bad Sackingen (DE); Elke Schmidt, Bad Sackingen (DE); Dietmar Birgel, Schopfheim (DE)

(73) Assignee: ENDRESS+HAUSER SE+CO.KG, Maulburg (DE)

( * ) Notice: Subject to any disclaimer, the term of this patent is extended or adjusted under 35 U.S.C. 154(b) by 860 days.

(21) Appl. No.: 14/408,345

(22) PCT Filed: Jun. 18, 2013

(86) PCT No.: PCT/EP2013/062580
§ 371 (c)(1),
(2) Date: Dec. 16, 2014

(87) PCT Pub. No.: WO2013/189911
PCT Pub. Date: Dec. 27, 2013

(65) Prior Publication Data
US 2015/0183061 A1  Jul. 2, 2015

(30) Foreign Application Priority Data

Jun. 19, 2012  (DE) .................. 10 2012 105 297

(51) Int. Cl.
*B23K 31/02* (2006.01)
*H05K 3/34* (2006.01)
*B23K 1/00* (2006.01)

(52) U.S. Cl.
CPC ............ *B23K 31/02* (2013.01); *B23K 1/0016* (2013.01); *H05K 3/3431* (2013.01);
(Continued)

(58) Field of Classification Search
CPC .... B23K 31/02; Y10T 403/479; H05K 3/3431
See application file for complete search history.

(56) References Cited

U.S. PATENT DOCUMENTS 2,634,700 A * 4/1953 Bagsar ...................... B63B 3/14
114/79 W
5,539,611 A * 7/1996 Hegner ................ C04B 37/026
174/152 GM
(Continued)

FOREIGN PATENT DOCUMENTS

CN  101369559 A  2/2009
DE  3042085 A1  6/1981
(Continued)

OTHER PUBLICATIONS

German Search Report, German PTO, Munich, Mar. 14, 2013.
(Continued)

*Primary Examiner* — Jonathan P Masinick
(74) *Attorney, Agent, or Firm* — Bacon & Thomas, PLLC

(57) ABSTRACT

A method for connecting a component to a support via soldering between a first contact surface of the component and a second contact surface of the support. The method is distinguished by features including that at least one spacer is embodied in such a manner and arranged between the first contact surface and the second contact surface that the first contact surface and the second contact surface are spaced from one another, and that the soldering is executed in such a manner that the component and the support are connected with one another via the first contact surface and the second (Continued)

contact surface. Also claimed is a component connectable with a support via soldering is intended.

2 Claims, 2 Drawing Sheets

(52) U.S. Cl.
CPC .............. *H05K 2201/0367* (2013.01); *H05K 2201/2036* (2013.01); *Y02P 70/613* (2015.11); *Y10T 403/479* (2015.01)

(56) References Cited

U.S. PATENT DOCUMENTS

| | | | | |
|---|---|---|---|---|
| 5,684,677 | A | 11/1997 | Uchida | |
| 5,914,536 | A | 6/1999 | Shizuki | |
| 6,267,009 | B1* | 7/2001 | Drewes | G01L 9/0075 361/283.4 |
| 7,938,014 | B2* | 5/2011 | Meehan | G01L 1/142 73/718 |
| 8,787,033 | B2* | 7/2014 | Nakagawa | H01L 23/49838 361/803 |
| 2013/0161376 | A1* | 6/2013 | Saito | B23K 31/02 228/180.1 |
| 2015/0003899 | A1* | 1/2015 | Lankenau | B23K 31/02 403/270 |

FOREIGN PATENT DOCUMENTS

| | | |
|---|---|---|
| DE | 3536431 A1 | 4/1987 |
| DE | 19610112 A1 | 9/1997 |
| DE | 10332573 A1 | 2/2005 |
| DE | 102004005030 A1 | 8/2005 |
| DE | 102004055511 B3 | 2/2006 |
| DE | 102005050830 A1 | 4/2007 |
| DE | 102014200210 B3 * 5/2015 ............ B23K 31/02 |  |
| GB | 2062963 A | 5/1981 |
| JP | 2000151085 A | 5/2000 |
| WO | 2005008766 A1 | 1/2005 |
| WO | 10332573 A1 | 2/2005 |
| WO | 2005074337 A1 | 8/2005 |

OTHER PUBLICATIONS

International Search Report, EPO, The Netherlands, dated Sep. 20, 2013.
English Translation of the International Preliminary Report on Patentability, WIPO, Geneva, dated Dec. 31, 2014.

* cited by examiner

METHOD FOR CONNECTING A COMPONENT TO A SUPPORT VIA SOLDERING AND COMPONENT CONNECTABLE WITH A SUPPORT

TECHNICAL FIELD

The present invention relates to a method for connecting a component to a support via soldering between a first contact surface of the component and a second contact surface of the support. Furthermore, the invention relates to a component having a first contact surface for connecting with a second contact surface of a support via soldering.

BACKGROUND DISCUSSION

Modern measuring devices have a large number of electronic components. The electronic components are, as a rule, connected to a support via soldering. The connection of larger components to a support is often produced by means of several connecting elements, for example, in the form of bolt-shaped components.

For manufacturing the soldered connection, as a rule, solder is applied on the support, the component to be connected superimposed on the solder and the so populated support fed to a soldering oven. There, the solder is melted and so a connection produced between component and support. The component's own weight and/or a force involved with the superimposing of the component can mean that the component sinks when the solder melts, such that almost no gap at all remains between the component and the support. Often there remains only a very thin, few micrometer thick, solder layer beneath the component. Such a connection is susceptible to crack formation, especially resulting from fluctuating temperatures. Cracks weaken the mechanical stability of the connection and can lead to a releasing of the component from the support. Moreover, electrical contact brought about by the connection can be lost.

SUMMARY OF THE INVENTION

An object of the invention is to provide a method enabling the manufacture of a reliable and stable connection between a component and a support via soldering. Furthermore, a component is to be provided, which is connectable via soldering reliably and stably to a support.

The invention is achieved as regards the method aspect by features including that at least one spacer is embodied in such a manner and arranged between the first contact surface and the second contact surface that the first contact surface and the second contact surface are spaced from one another and that the soldering is executed in such a manner that the component and the support are connected with one another via the first contact surface and the second contact surface.

The two contact surfaces are connected with one another via solder, when the diameter of the spacer is smaller than the diameter of the contact surfaces. In case the spacer and the contact surface have the same or at least essentially the same diameter, then the connection is produced via the spacer. The solder is, for example, a soft solder. Especially for a support in the form of a ceramic material, preferably an active solder is used.

In a first embodiment, the spacer is manufactured of a material, whose melting point lies above the temperature reigning in the soldering. The spacer at least essentially retains its shape in this embodiment during the soldering.

In an embodiment, the spacer is formed on the component. The spacer can especially be one-piece with the component or with at least a section of the component having the contact surface.

In an additional embodiment, the spacer is bolt-shaped.

Another embodiment provides that a formed part is placed on the bolt-shaped spacer, wherein the height of the formed part at least equals the height of the spacer, and wherein the material of the formed part is selected in such a manner that the formed part at least essentially retains its shape in the soldering. In an associated further development, solder is applied on the formed part and melts during the soldering. This embodiment thus combines two materials with different melting points, wherein at least the lower melting point is reached in the soldering.

In an embodiment, the spacer is embodied as a formed part. For example, the spacer is a solder preform. During the soldering, the solder preform can melt or at least its surface can melt, in order to manufacture the connection between the two contact surfaces. At the same time, the solder preform maintains a spacing between the contact surfaces before the soldering and assures the presence of a solder layer of a certain thickness after the soldering.

An embodiment includes that the formed part and/or the spacer are/is manufactured of a ductile material.

In an embodiment, the component is connected to a ceramic support. For example, the support material is an aluminum oxide ceramic.

In an embodiment, the soldering is performed with an active solder. The terminology, active solder, means a solder, which contains a reactive component. The active solder is, for example, a silver copper alloy or a silver copper nickel alloy, each containing titanium hydride as the reactive component.

Furthermore, the invention relative to the component is achieved by features including that on the first contact surface of the component at least one spacer is formed, which is embodied to bring about a separation between the first contact surface of the component and the second contact surface of the support In an embodiment, the component and the spacer are manufactured of a metal or a metal alloy.

In an embodiment of the component, the spacer has a height between 100 micrometer and 300 micrometer. The terminology, height of the spacer, refers to the dimension along an axis, which extends perpendicular to the first contact surface. The height gives how far the spacer projects from the first contact surface and defines the minimum separation, which the first contact surface has from the second contact surface of the support in the case of connection with the support.

In an embodiment of the component, the diameter of the spacer is less than the diameter of the first contact surface of the component.

In an embodiment, the diameter of the spacer amounts to between 10 and 40 percent, preferably between 15 and 20 percent, of the diameter of the first contact surface of the component. Preferably, the spacer is arranged in the center of the first contact surface.

The component can be, for example, an electronic component or a connecting element for establishing a connection between an electronic component and a support or an electronic assembly comprising a number of components and a support.

The invention can be applied, for example, in the manufacture of pressure sensors, wherein, in such case, a sensor electronics mounted on a circuit board is connected by means of a plurality of bolt-shaped components via soldering with a ceramic, pressure sensitive, sensor element. The metal or metallized, bolt-shaped components and the solder joints provide simultaneously also the electrical contacting of the sensor element. The spacer assures that an elastic element remains between the bolt-shaped components and the sensor element, so that a spring biased connection between sensor element and sensor electronics results.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWINGS

Figure 1:
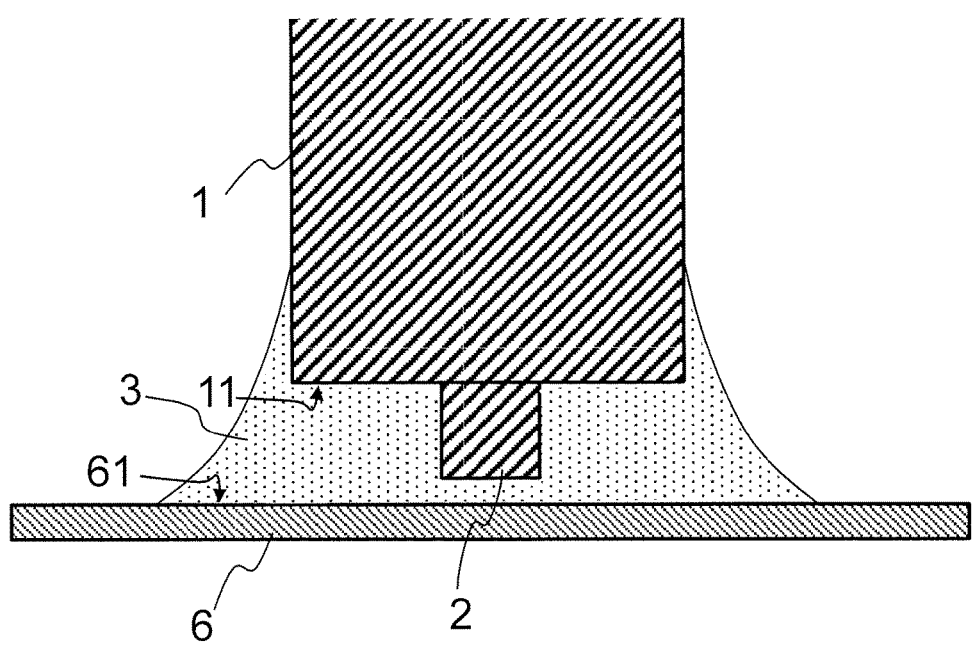
FIG. 1 is a schematic, detail view of the soldering between a component and a support.

FIG. 1 shows a component 1 of the invention, which is connected to a support 6 via soldering. Component 1 includes a first contact surface 11 for connection with the support 6. Preferably, at least the contact surface 11 is metal. Support 6 is a plate or a body with at least one 2-dimensional section, which serves as a second contact surface 61. Support 6 is manufactured, for example, of a synthetic material, a glass or a ceramic. Preferably, support 6 is metallized in the region of the second contact surface 61. Component 1 is preferably manufactured of a metal or a metal alloy, for example, of tantalum.

Formed on the contact surface 11 of the component 1 is a spacer 2. Spacer 2 is manufactured at least partially of a ductile material. For example, spacer 2 is composed of a metal or a metal alloy. Spacer 2 can be connected fixedly with the component 1, for example, by means of welding or can also be embodied as one-piece with the component 1. Especially, a usual component can also be subsequently equipped with a spacer 2, in order that it can be connected stably to a support 6. In the illustrated example of an embodiment, spacer 2 has a bolt shape. Other forms are, however, likewise suitable. The height of the spacer 2 defines the minimum separation, which the first contact surface 11 has from the support 6. This minimum separation lies preferably between 0.1 mm and 0.3 mm.

For connecting the component 1 with the support 6, solder 3, for example, in the form of a solder paste, is applied on the second contact surface 61 and the component 1 superimposed in such a manner on the support 6 that the first contact surface 11 of the component 1 is positioned above the second contact surface 61 of the support 6. In the case of a ceramic support 6, the soldering can also occur by means of active solder. The ceramic support 6 is manufactured, for example, of aluminum oxide. Suited as active solder is, for example, an alloy of silver and copper, or silver, copper and nickel, with addition of titanium hydride, especially Ag72Cu28+12% Ti-hydride or Ag56Cu42Ni3+8% Ti-hydride. Spacer 2 maintains a separation between the two contact surfaces 11, 61. This separation equals at least the height of the spacer 2. Subsequently, this assembly of parts is heated, for example, by feeding the populated support 6 to a soldering oven. The solder 3 melts and fills the intermediate space present between the first contact surface 11 and the second contact surface 61 due to the bolt-shaped spacer 2, so that the first contact surface 11 becomes connected with the second contact surface 61. Spacer 2 assures that an elastic element remains under the component 1.

Figure 2A:
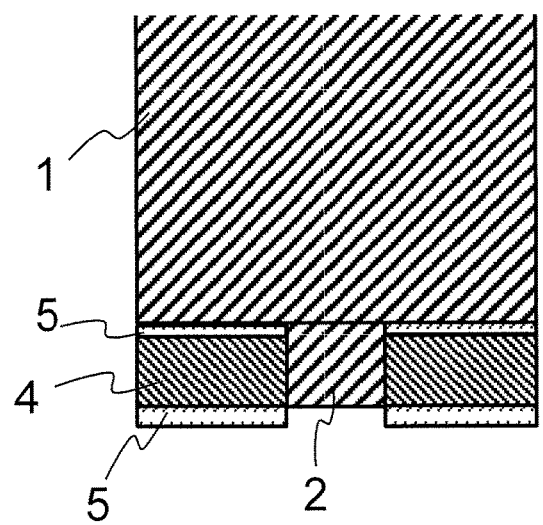
FIG. 2a is schematically, an advantageous construction of a component before the soldering.

FIG. 2a shows a component 1 of the invention, which is equipped with a formed part 4 for further improving the stability of the connection. Formed part 4 is composed of a ductile material, for example, a soft solder, and is provided with a likewise ductile coating 5, for example, in the form of a solder paste. The ductility of the formed part 4 is, in such case, at least as great as that of the coating 5. Coating 5 is at least applied on the surfaces of the formed part 4 facing the contact surfaces 11, 61. The thickness of the coating 5 amounts to preferably between 10 and 20 percent of the height of the formed part. For example, the formed part 4 is between 100 and 300 micrometer, especially about 200 micrometer, high and the coating between 20 and 50 micrometer, especially about 30 micrometer, thick.

The materials of the formed part 4 and the coating 5 are preferably different. In such case, the coating 5 has, compared with the formed part 4, a lower melting point. Such is at least 5-10° C. less than that of the formed part 4 and corresponds to the soldering temperature reached in the soldering process, so that the coating 5 preferably completely melts. The melting temperature of the formed part 4 lies above the soldering temperature, so that the formed part 4 is not melted during the soldering process. In an embodiment, especially in case in which the formed part 4 is composed of a solder, the melting temperature of the formed part 4 can also be low, so that at least the surface of the formed part 4 begins to melt. For example, the material of the formed part 4 is essentially PbSn5. Coating 5 of the formed part 4 is, for example, SnAgCu.

Instead of the coating 5, the second material can also be embodied as a formed part. Essential in the embodiment with two different materials is only that besides the formed part 4 a second material, especially a solder, is present, which melts at a lower temperature and cares for a fixed connection between component 1 and formed part 4, as well as formed part 4 and support 6. Formed part 4, the coating 5 of the formed part 4 and/or the second contact surface 61 can be provided with flux before the soldering process.

An embodiment without coating 5 is likewise possible. The material of the formed part 4 and the soldering temperature are, in this case, selected in such a manner, respectively matched to one another, that the formed part 4 melts or at least partially melts and, thus, cares for the connection between the first contact surface 11 of the component 1 and the second contact surface 61 of the support 6.

Formed part 4 can also be superimposed on the second contact surface 61 of the support 6 or secured to such. Component 1 with the formed spacer 2 is then superimposed in such a manner on the support 6 that the spacer 2 engages in the formed part 4. Such an embodiment provides the advantage that the component 1 is centered and possesses an optimal orientation on the support 6. If the formed part 4 is already fixedly connected with the support 6, additional stability is achieved, since the component 1 and the solder 4 cannot slip relatively to one another during the transport to the soldering oven.

Figure 2B:
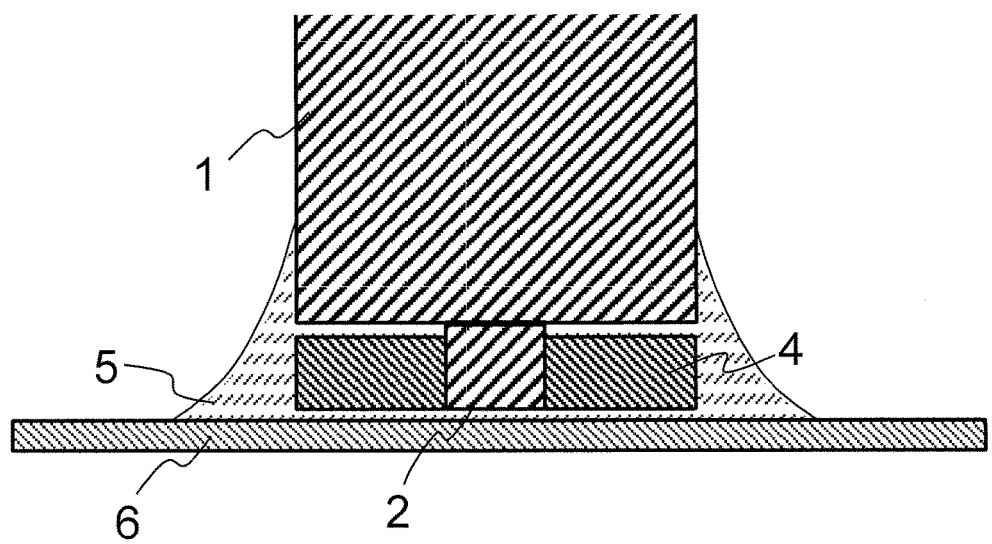
FIG. 2b is schematically, the component of FIG. 2a after soldering.

FIG. 2b shows the component 1 with formed part 4 according to FIG. 2a and the support 6 after soldering. The dimensioning of the coated formed part 4, 5 is selected in such a manner that the height of the formed part 4 with coating 5 is at least slightly greater than the height of the spacer 2. In this way, it is assured in the soldering that solder is located also under the spacer 2. During melting of the coating 5 of the formed part 4, a part of the coating 5 flows under the spacer 2, so that a preferably traversing, solder layer is formed, which covers the second contact surface 61. In this way, an especially stable contact is produced between component 1 and support 6. Formed part 4 and coating 5 form an elastic or ductile element between support 6 and component 1 and provide an improved stability of the connection between support 6 and component 1.

In an embodiment (not shown), the component 1 has no spacer 2. Spacer 2 is then either a separate component, which is positioned between the support 6 and the component 1 before the soldering process, or the spacer 2 is part of the support 6. For example, the spacer 2 is bonded with adhesive or soldered to the second contact surface 61. The solder for connection of the component 1 with the support 6 can then be present in any form, for example, as paste or formed part, for manufacturing a reliable and stable connection.

In an additional embodiment (not shown), the formed part 4 serves as spacer 2. Preferably, the formed part 4 is then disc shaped, wherein the diameter of the disk essentially equals the diameter of the first contact surface 11 of the component 1. In order to assure a correct positioning for soldering, the formed part 4 is preferably secured to the component 1 or to the support 6, for example, by means of a conductive adhesive. The conductive adhesive provides a fixed and conductive connection between the first contact surface 11, respectively the second contact surface 61, and the formed part 4. In the following soldering process, then the connection to the respectively other contact surface 61, respectively 11, is produced. Advantageously to this end, the exposed lateral surface of the formed part 4 is coated with a solder paste, which in the soldering melts and manufactures the connection between formed part 4 and support 6, respectively component 1. Formed part 4 can in this embodiment be manufactured of a low melting material and melt during the soldering, or from a high melting material, so that it does not melt or only partially melts in the soldering process. In such case, it should always be assured that at least a part of the formed part 4 lies after the soldering process as an elastic or ductile element between component 1 and support 6.

There are thus different options available for connecting the component 1 with the support 6 via a spacer 2. Spacer 2 serves in each case as an elastic element between component 1 and support 6 and so leads to a stable connection. Spacer 2 can be part of the component 1, part of the support 6 or a self-sufficient component. For further improving the stability, additionally a formed part 4, especially a solder preform, can be present placed on the spacer 2, respectively surrounding the spacer 2. Moreover, the spacer 2 can be embodied as a formed part 4, especially as a solder preform.

LIST OF REFERENCE CHARACTERS 1 component
11 first contact surface
2 spacer
3 solder
4 formed part
5 coating
6 support
61 second contact surface

The invention claimed is:

1. A method for the manufacturing of pressure sensors, wherein a sensor electronics on a circuit board is connected by means of a plurality of components via soldering with a ceramic, pressure sensitive, sensor element, the method comprising:
   connecting the components to the ceramic sensor element via soldering between a first contact surface of each of the components and a second contact surface of the sensor element,
   wherein solder joints obtained by said soldering provide simultaneously also the electrical contacting of the sensor element,
   wherein at least one spacer is embodied in such a manner and arranged between the first contact surface and the second contact surface that the first contact surface and the second contact surface are spaced from one another,
   wherein the spacer is formed on the cylindrical components,
   wherein the spacer has a height between 100 µm and 300 µm, and
   wherein the diameter of the spacer amounts to between 10 and 40 percent of the diameter of the first contact surface of the component,
   wherein the components and the spacer are manufactured of a metal or a metal alloy,
   wherein the spacer is one-piece with the component or with at least a section of the component having the contact surface,
   wherein the solder is applied on the second contact surface in the form of a solder paste and the components are superimposed in such a manner on the sensor element that the first contact surface of the components is positioned above the second contact surface of the sensor element,
   wherein the soldering is executed in such a manner that the components and the sensor element are connected with one another via the first contact surface and the second contact surface.

2. The method as claimed in claim 1, wherein:
the diameter of the spacer amounts to between 15 and 20 percent of the diameter of the first contact surface of the component.

* * * * *